(12) United States Patent
Jain et al.

(10) Patent No.: US 11,862,717 B2
(45) Date of Patent: Jan. 2, 2024

(54) LATERAL BIPOLAR TRANSISTOR STRUCTURE WITH SUPERLATTICE LAYER AND METHOD TO FORM SAME

(71) Applicant: GlobalFoundries U.S. Inc., Malta, NY (US)

(72) Inventors: Vibhor Jain, Clifton Park, NY (US); John J. Pekarik, Underhill, VT (US); Alvin J. Joseph, Williston, VT (US); Alexander M. Derrickson, Saratoga Springs, NY (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 79 days.

(21) Appl. No.: 17/456,395

(22) Filed: Nov. 24, 2021

(65) Prior Publication Data

US 2023/0064512 A1  Mar. 2, 2023

Related U.S. Application Data

(60) Provisional application No. 63/236,355, filed on Aug. 24, 2021.

(51) Int. Cl.
*H01L 29/66* (2006.01)
*H01L 29/735* (2006.01)
(Continued)

(52) U.S. Cl.
CPC ........ *H01L 29/735* (2013.01); *H01L 29/0808* (2013.01); *H01L 29/0821* (2013.01);
(Continued)

(58) Field of Classification Search
CPC .............. H01L 29/735; H01L 29/0808; H01L 29/0821; H01L 29/1008; H01L 29/158; H01L 29/6625
See application file for complete search history.

(56) References Cited

U.S. PATENT DOCUMENTS 7,202,494 B2  4/2007 Blanchard et al.
7,279,701 B2  10/2007 Kreps
(Continued)

OTHER PUBLICATIONS

E Simoen et al., "Deep levels in silicon-oxygen superlattices," Semiconductor Science and Technology 31 (2016), 025015 (8pp).

*Primary Examiner* — Jay C Chang
*Assistant Examiner* — Siangluai Mang
(74) *Attorney, Agent, or Firm* — Francois Pagette Hoffman Warnick LLC

(57) ABSTRACT

Embodiments of the disclosure provide a lateral bipolar transistor structure with a superlattice layer and methods to form the same. The bipolar transistor structure may have a semiconductor layer of a first single crystal semiconductor material over an insulator layer. The semiconductor layer includes an intrinsic base region having a first doping type. An emitter/collector (E/C) region may be adjacent the intrinsic base region and may have a second doping type opposite the first doping type. A superlattice layer is on the E/C region of the semiconductor layer. A raised E/C terminal, including a single crystal semiconductor material, is on the superlattice layer. The superlattice layer separates the E/C region from the raised E/C terminal.

20 Claims, 17 Drawing Sheets

(51) Int. Cl.
  *H01L 29/08* (2006.01)
  *H01L 29/15* (2006.01)
  *H01L 29/10* (2006.01)

(52) U.S. Cl.
  CPC ........ *H01L 29/1008* (2013.01); *H01L 29/158* (2013.01); *H01L 29/6625* (2013.01)

(56) References Cited

U.S. PATENT DOCUMENTS

| | | |
|---|---|---|
| 7,433,729 B2 | 10/2008 | Setlak et al. |
| 7,446,002 B2 | 11/2008 | Mears et al. |
| 7,517,702 B2 | 4/2009 | Halilov et al. |
| 7,531,829 B2 | 5/2009 | Blanchard |
| 7,535,041 B2 | 5/2009 | Blanchard |
| 7,598,515 B2 | 10/2009 | Mears et al. |
| 7,781,827 B2 | 8/2010 | Rao |
| 8,482,101 B2 | 7/2013 | Benoit et al. |
| 8,558,282 B1 * | 10/2013 | Cai ................ H01L 29/161 257/E21.372 |
| 9,899,479 B2 | 2/2018 | Mears et al. |
| 10,916,642 B2 | 2/2021 | Jain et al. |
| 2002/0149033 A1 * | 10/2002 | Wojtowicz ........ H01L 29/7371 257/E29.189 |
| 2004/0227165 A1 * | 11/2004 | Wang ................ H01L 29/768 257/222 |
| 2005/0242373 A1 * | 11/2005 | Ahlgren ............ H01L 29/0804 257/E29.183 |
| 2006/0220118 A1 | 10/2006 | Stephenson et al. |
| 2006/0273299 A1 | 12/2006 | Stephenson et al. |
| 2007/0015344 A1 | 1/2007 | Mears et al. |
| 2007/0063185 A1 * | 3/2007 | Rao ................ H01L 29/152 257/18 |
| 2013/0099287 A1 * | 4/2013 | Moser ................ H01L 29/0817 438/312 |
| 2015/0179778 A1 * | 6/2015 | Cai ................ H01L 29/66265 257/557 |
| 2016/0087068 A1 * | 3/2016 | Cai ................ H01L 29/7317 257/526 |
| 2018/0040743 A1 | 2/2018 | Mears et al. |
| 2020/0286995 A1 * | 9/2020 | Hashemi ............ H01L 29/737 |
| 2021/0083111 A1 | 3/2021 | Pekarik et al. |
| 2021/0104621 A1 | 4/2021 | Jain et al. |
| 2021/0202717 A1 | 7/2021 | Jain et al. |

* cited by examiner

LATERAL BIPOLAR TRANSISTOR STRUCTURE WITH SUPERLATTICE LAYER AND METHOD TO FORM SAME

BACKGROUND

1. Technical Field

The present disclosure provides a lateral bipolar structure transistor with a superlattice layer, and related methods to form the same.

2. Background Art

Present technology is at atomic level scaling of certain micro-devices such as logic gates, bipolar transistors, field effect transistors (FETs), and capacitors. Circuit chips with millions of such devices are common. The structure of a lateral bipolar transistor defines several of its properties during operation. Conventional integrated circuits may employ vertical bipolar transistors, but these types of devices may have higher costs and/or operational parameters that do not meet certain constraints. Lateral bipolar transistors may not carry these concerns but may be difficult to form in some settings (e.g., on semiconductor on insulator (SOI) layers). This challenge may be especially pronounced when a circuit fabricator must precisely control the amount of dopant materials within the SOI layer at the junction between a base and an emitter or collector. In some cases, it is undesirable for dopants to diffuse into the SOI layer from nearby doped semiconductor materials, e.g., the relatively highly doped emitter or collector terminal(s).

SUMMARY

The illustrative aspects of the present disclosure are designed to solve the problems herein described and/or other problems not discussed.

Embodiments of the disclosure provide a lateral bipolar transistor structure including: a semiconductor layer over an insulator layer and including a first single crystal semiconductor material, wherein the semiconductor layer further includes: an intrinsic base region having a first doping type, and a first emitter/collector (E/C) region adjacent the intrinsic base region having a second doping type opposite the first doping type, a superlattice layer on the first E/C region of the semiconductor layer; and a first raised E/C terminal on the superlattice layer and including a second single crystal semiconductor material, wherein the superlattice layer separates the first E/C region from the first raised E/C terminal.

Additional embodiments of the disclosure provide a lateral bipolar transistor structure including: a semiconductor layer over an insulator layer and including a first single crystal semiconductor material, wherein the semiconductor layer further includes: an intrinsic base region having a first doping type, and a pair of (E/C) regions having a second doping type opposite the first doping type, wherein the intrinsic base region is horizontally between the pair of E/C regions; a pair of superlattice layers each on a respective one of the pair of E/C regions of the semiconductor layer; and a pair of raised E/C terminals each on a respective one of the pair of superlattice layers and including a second single crystal semiconductor material, wherein each of the pair of superlattice layers is between one of the pair of E/C regions and one of the pair of raised E/C terminals.

Further embodiments of the disclosure provide a method of forming a lateral bipolar transistor structure, the method including: forming a semiconductor layer including a first single crystal semiconductor material, the semiconductor layer further including: an intrinsic base region having a first doping type, and a first emitter/collector (E/C) region adjacent the intrinsic base region, and having a second doping type opposite the first doping type, forming a superlattice layer on the first E/C region of the semiconductor layer; and forming a raised first emitter/collector (E/C) terminal including a second single crystal semiconductor material on the superlattice layer, wherein the superlattice layer separates the first E/C region from the first raised E/C terminal.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
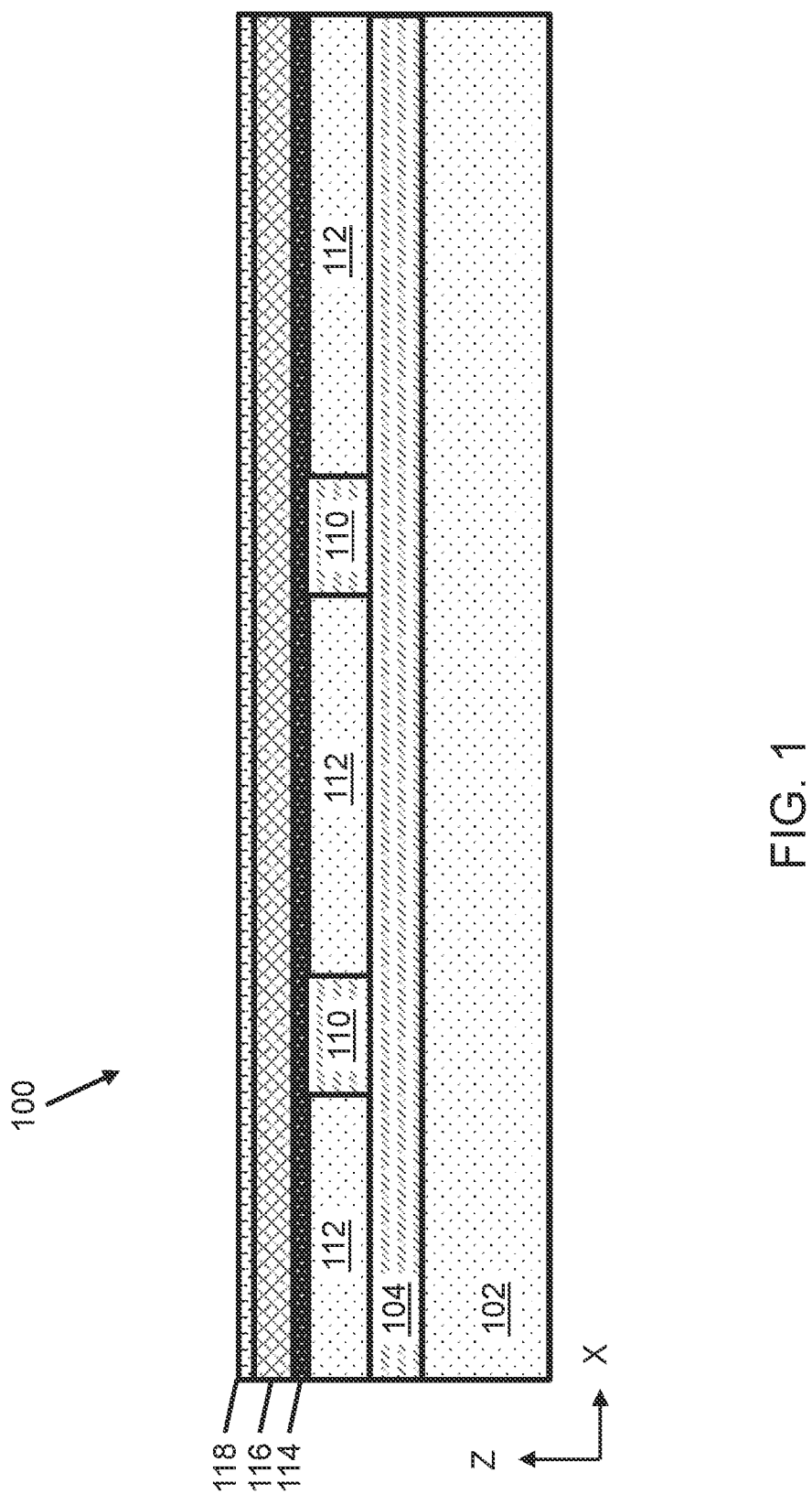
FIG. 1 depicts a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a bipolar transistor structure in which a superlattice layer is on a portion of semiconductor layer, e.g., to impede dopant diffusion into the semiconductor layer from overlying layers. The term "superlattice layer," as used herein, may refer to a layer of material formed from alternating layers of two or more distinct elements. One example of a superlattice material may include, e.g., a layer formed of multiple alternating layers of silicon (Si) and oxygen (O). A bipolar transistor according to the disclosure may include a semiconductor layer formed of single crystal semiconductor over an insulator layer, perhaps in the form of a semiconductor on insulator (SOI) layer of any desired thickness, including layers such as a fully depleted semiconductor on insulator (FDSOI) layer. The semiconductor layer may have an intrinsic base region of a first doping type, and an emitter/collector (E/C) region of a second (opposite) doping type adjacent the intrinsic base region. A superlattice layer is on the E/C region, and a raised E/C terminal of a second single crystal semiconductor material is on the superlattice layer. The superlattice layer separates the raised E/C terminal from the E/C region, thus impeding dopant diffusion from the raised E/C terminal into the E/C region. During operation, the superlattice layer allows the raised E/C to remain significantly more conductive (i.e., more highly doped) than the E/C region thereunder.

BJT structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials.

Referring to FIG. 1, a preliminary structure 100 (simply "structure" hereafter) suitable to form a bipolar transistor structure according to embodiments of the disclosure is shown. Preliminary structure 100 may be processed as described herein to yield one or more lateral BJT structures with a marker layer on doped regions of semiconductor material for defining an E/C region. However, it is understood that other techniques, ordering of processes, etc., may be implemented to yield the same bipolar transistor structure(s) or similar bipolar transistor structures in further embodiments. FIG. 1 shows a cross-sectional view of structure 100 with a substrate 102 including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entire semiconductor substrate 102 may be strained.

Substrate 102 optionally may include embedded elements for electrically separating active materials formed thereon from other regions and/or materials within substrate 102. A buried insulator layer 104 optionally may be formed within substrate 102, e.g., by converting silicon material within substrate 102 into a higher-resistive material such as polycrystalline or amorphous silicon (poly-Si). Buried insulator layer 104 may extend horizontally throughout substrate 102, and/or may be formed selectively under locations where active materials are formed, examples of which are discussed elsewhere herein. In further implementations, buried insulator layer 104 may include oxygen doping to form a dielectric insulator or a buried oxide ("BOX") layer underneath substrate 102 and electrically isolate overlying active semiconductor materials. Buried insulator layer 104 thus may include other elements or molecules such as Ge, N, or Si. However embodied, buried insulator layer 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have buried insulator layer 104, and/or multiple insulator layers 104 may be formed within substrate 102 at different depths. Additionally, various conductive particles ("dopants") may be introduced into substrate 102 via a process known as "pre-doping" of substrate 102 above buried insulator layer 104.

Embodiments of the disclosure may include forming a set of trench isolations (TIs) 110 by forming and filling trenches (not labeled) with an insulating material such as oxide, to isolate one region of substrate 102 from an adjacent region of substrate 102. Various portions of a bipolar transistor structure, including the active semiconductor materials thereof and/or other devices where applicable, may be disposed within an area of substrate 102 that is isolated by TI(s) 110. According to one example, two TIs 110 are formed, with a semiconductor layer 112 being horizontally between the two TIs 110. Semiconductor layer 112 may be processed via etching, deposition, doping, etc., to form portions of a lateral bipolar transistor. TIs 110 may be formed before active materials are formed within substrate 102, but this is not necessarily true in all implementations.

Each TI 110 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TI(s) 110 and semiconductor layer 112 may be planarized (e.g., by chemical mechanical planarization or other technique(s)) such that the upper surface(s) of semiconductor layer(s) 112 is/are substantially coplanar with the upper surface of adjacent TIs 110.

Structure 100 may include an insulator layer 114 on semiconductor layer 112 and TIs 110. Insulator layer 114 may be used to form an insulative barrier between various semiconductor materials and certain adjustable terminals thereover, e.g., the base terminal of a lateral bipolar transistor according to the disclosure, metal gate structures of a FET-type transistor formed elsewhere over substrate 102, etc. The material composition of insulator layer 114 may include, as non-limiting examples, insulators such as hafnium silicate (HfSiO), hafnium oxide ($HfO_2$), zirconium silicate ($ZrSiO_x$), zirconium oxide ($ZrO_2$), silicon oxide ($SiO_2$), tetraethyl orthosilicate $Si(OC_2H_5)_4$ ("TEOS") used to form $SiO_2$, silicon nitride ($Si_3N_4$), silicon oxynitride (SiON), high-k material or any combination of various currently known or later developed insulator layer materials. Insulator layer 114 may be formed, e.g., by deposition over semiconductor layer(s) 112 and TI(s) 110 such that insulator layer 114 covers semiconductor layer 112 and TI(s) 110.

Structure 100 also may include a polycrystalline semiconductor (simply "polycrystalline") layer 116 over insulator layer 114. Polycrystalline layer 116, when formed, may be electrically non-conductive or at least less conductive than semiconductor layer 112. Polycrystalline layer 116, in subsequent processing, may be converted and/or removed and replaced with active semiconductor material to define a portion of a base terminal (e.g., an extrinsic base) in a bipolar transistor structure. An insulative cap 118 including, e.g., one or more nitride insulators (e.g., silicon nitride (SiN)) and/or other dielectric materials, may be on polycrystalline layer 116 and may define an uppermost layer of structure 100. Insulative cap 118 may take the form of a "pad nitride" structured for allowing masking material(s) to be formed thereon for targeting, removing, and/or otherwise processing selected portions of structure 100.

Figure 2:
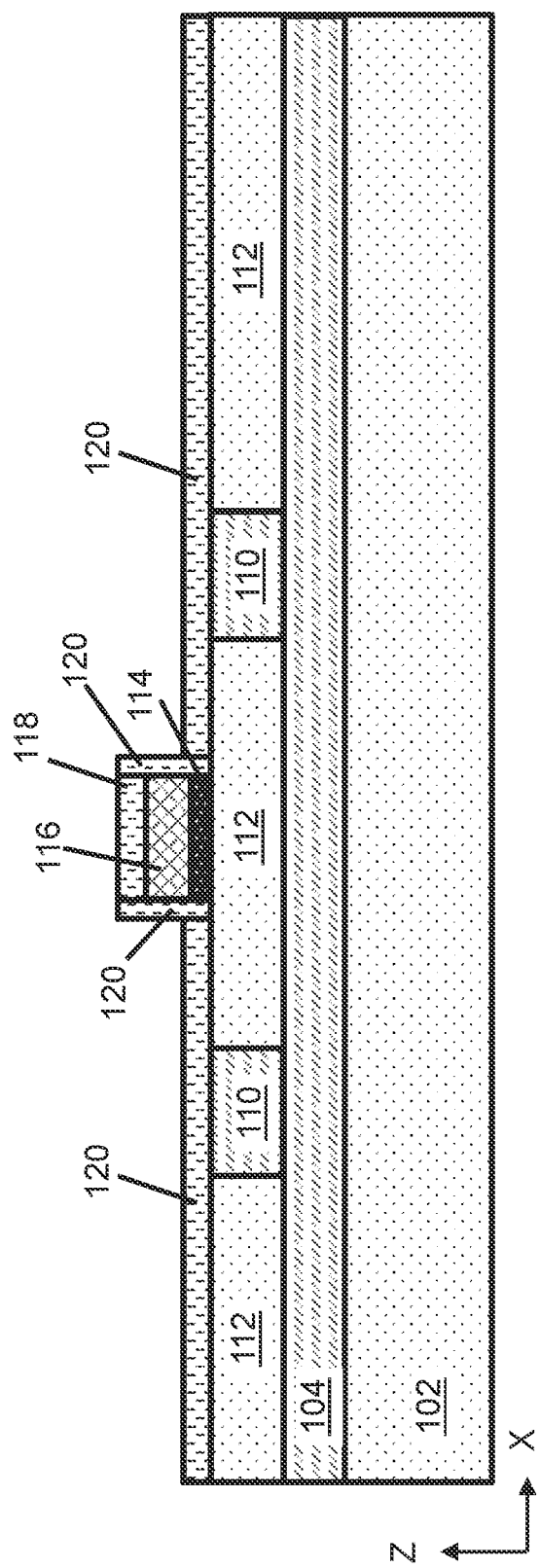
FIG. 2 depicts a cross-sectional view of forming a base structure from the initial structure according to embodiments of the disclosure.

FIG. 2 depicts removing targeted portions of insulator layer 114 and polycrystalline layer and forming a spacer layer 120 on the remaining material(s). Spacer layer(s) 120 can be provided as one or more bodies of insulating material formed on sidewalls of exposed material(s), e.g., by deposition, thermal growth, etc., to electrically and physically insulate materials subsequently formed on the coated material(s) from other components. According to an example, spacer layer 120 may have one or more of the same materials as insulative cap 118 (e.g., nitride insulator materials), such that spacer layer 120 increases the thickness of insulative cap 118 where it is formed above polycrystalline layer 116. Spacer layer(s) 120 may be formed, e.g., by depositing the corresponding spacer material such that it covers any exposed surfaces and sidewalls of TI(s), semiconductor layer(s) 112, insulator layer 114, and/or polycrystalline layer 116 where applicable. In some implementations, spacer layer(s) 120 may include a single layer or more than two layers.

Figure 3:
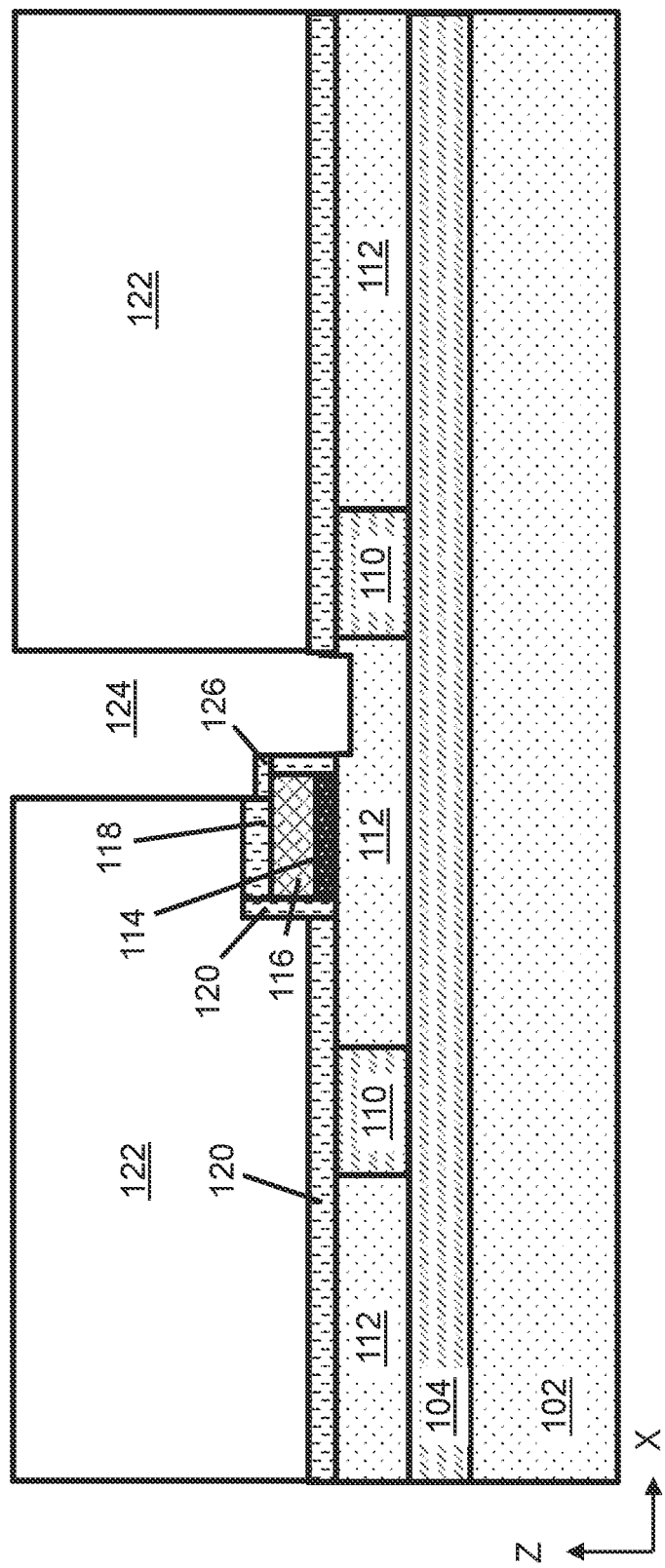
FIG. 3 depicts a cross-sectional view of targeting a region of semiconductor material for collector or emitter formation according to embodiments of the disclosure.

Referring now to FIG. 3, embodiments of the disclosure may include removing portions of spacer layer(s) 120 using a mask 122 with an opening 124 at a targeted position to expose semiconductor layer(s) 112. This removal process may include, for example, forming mask 122 patterned to expose selected portion(s) of spacer layer(s) 120 and/or insulative cap 118. Mask 122 may include any now known or later developed appropriate masking material, e.g., a nitride hard mask. As shown in FIG. 3, any appropriate etching process, e.g., a reactive ion etch (RIE), can remove insulative cap 118 and spacer layer(s) 120, to expose semiconductor layer(s) 112, e.g., horizontally adjacent one side of insulator layer 114 and polycrystalline layer 116. This process can be carried out at any location over semiconductor layer(s) 112 where one collector or emitter terminal of an eventual bipolar transistor structure will be formed.

Turning to FIG. 3, continued processing may include removing portions of spacer layer(s) 120 in opening 124 to expose semiconductor layer(s) 112. Etching via RIE, or selective etching processes to remove silicon nitride or other material(s) within spacer layer(S) 120, may be implemented to remove exposed portions of spacer layer(s) 120 within opening 124. The same process may also yield a recessed spacer 126 on portions of insulator layer 114 and polycrystalline layer 116, e.g., due to the greater thickness of insulative cap 118 above polycrystalline layer 116 and the downward etching having less effect on portions of spacer layer(s) 120 on sidewalls of insulator layer 114 and polycrystalline layer 116. The removing of spacer layer(s) 120 within opening 124 may also remove a portion of semiconductor layer 112 thereunder, or such portions of semiconductor layer 112 may be removed via a subsequent operation (e.g., selective or non-selective etch).

Figure 4:
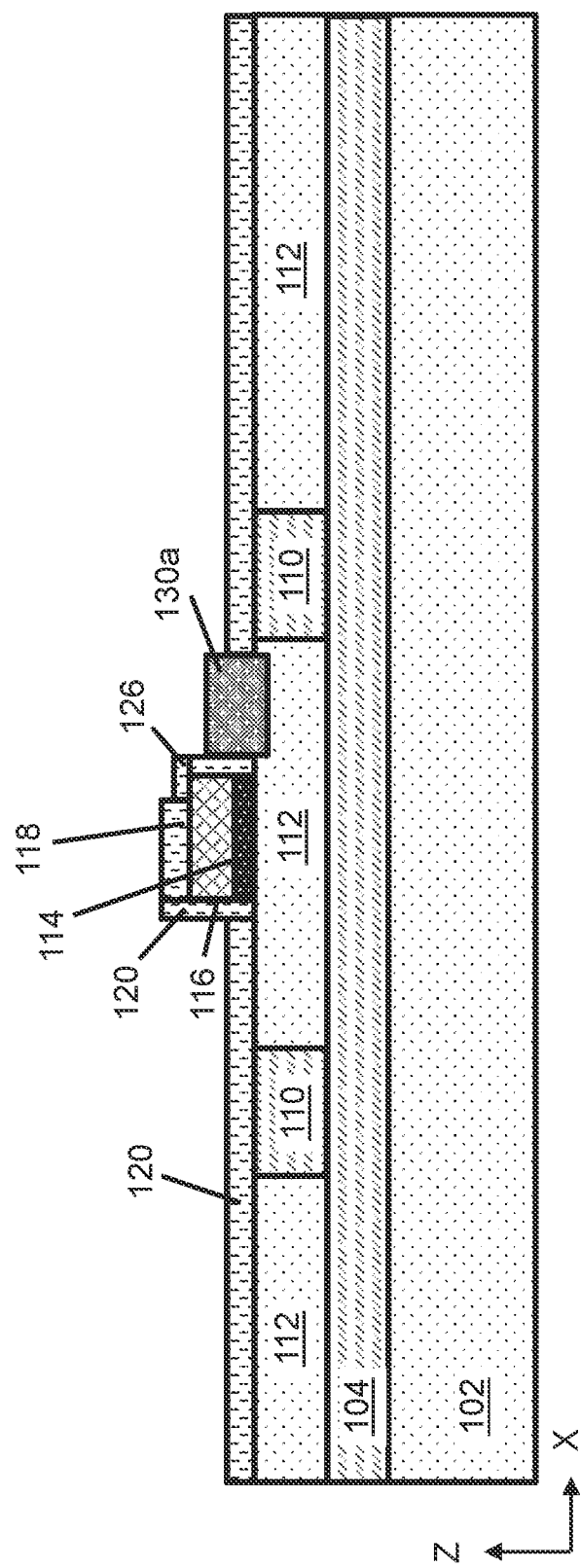
FIG. 4 depicts a cross-sectional view of forming a raised emitter/collector (E/C) terminal according to embodiments of the disclosure.

FIG. 4 depicts forming a raised emitter/collector (E/C) terminal 130a on semiconductor layer 112. In this phase of processing, raised E/C terminal 130a may be formed by deposition and/or epitaxial growth of silicon and/or other semiconductor materials on semiconductor layer 112 and may be of the same doping type as semiconductor layer 112. Raised E/C terminal 130a can be formed for example by selectively growing silicon material above semiconductor layer 112. Raised E/C terminal 130a, however, may have a higher concentration of dopants than semiconductor layer 112 thereunder. The higher doping concentration in raised E/C terminal 130a may increase electrical conductivity between raised E/C terminal 130a and any overlying contacts for transmitting current to the lateral bipolar transistor structure. In the case where E/C terminal 130a is formed using epitaxial growth and/or using deposition, raised E/C terminal 130a may extend above the upper surface of spacer layer 120.

Figure 5:
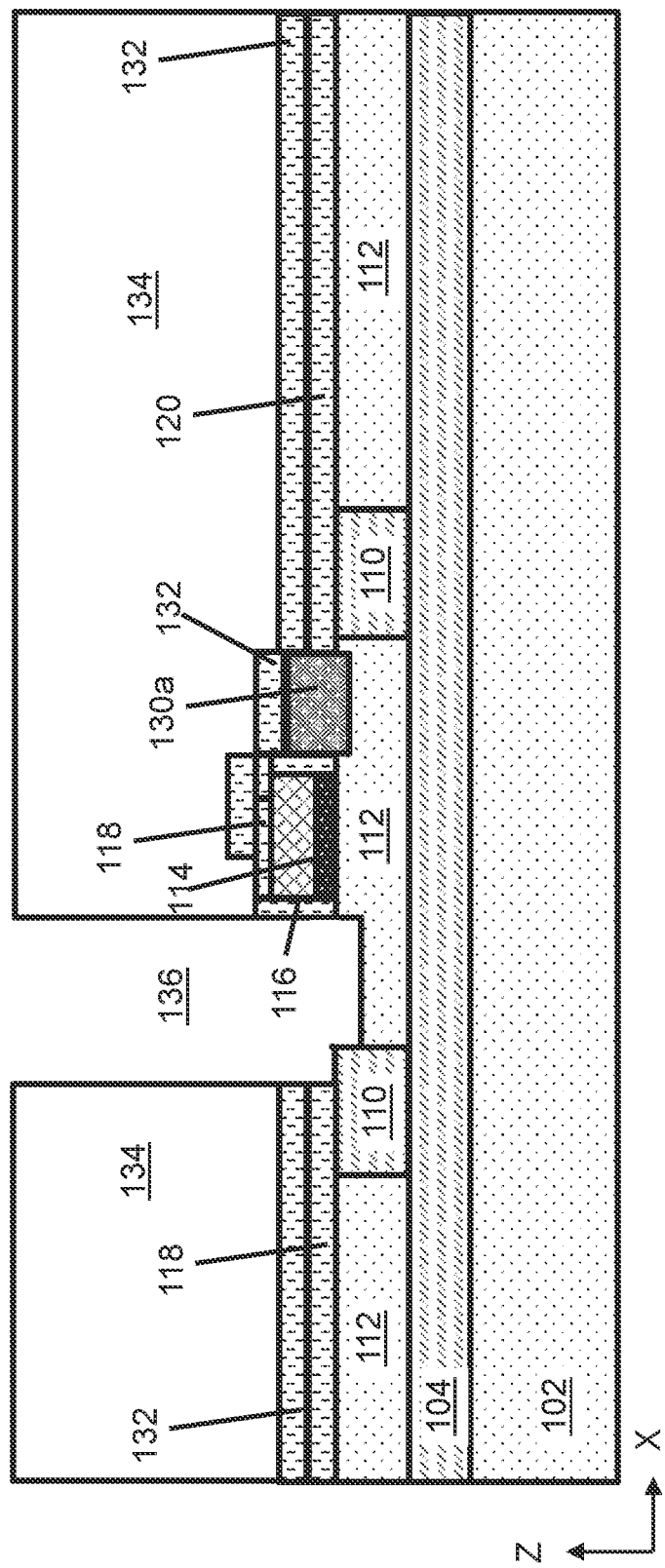
FIG. 5 depicts a cross-sectional view of targeting another region of semiconductor material for collector emitter formation according to embodiments of the disclosure.

Turning to FIG. 5, embodiments of the disclosure may include forming an additional spacer 132 on all exposed materials to cover insulator cap 118, spacer layer 120, recessed spacer 126, and raised E/C terminal 130a. Additional spacer 132 may be formed, e.g., to increase the thickness of previously recessed spacer materials (e.g., recessed spacer 126) and to protect active materials (e.g., raised E/C terminal 130a) from being modified or otherwise affected in subsequent processing of other materials. Further processing may include forming an additional mask 134 on targeted portions of additional spacer 132, without forming additional mask 134 over portions of semiconductor layer 112 where another E/C terminal is desired. Additional mask 134 may include an opening 136 that is vertically over semiconductor layer 112, and optionally, an adjacent portion of TI 110. Opening 136, moreover, may be positioned such that insulator layer 114 and polycrystalline layer 116 are horizontally between raised E/C terminal 130a and opening 136. Spacer layer 120 and additional spacer 132 may be removed within opening 136 to expose TI 110 and semiconductor layer 112 thereunder. As part of the same process, or as a subsequent process (e.g., selective silicon etching), a portion of semiconductor layer 112 also may be removed below opening 136 without significantly removing adjacent portions of TI 110.

Figure 6:
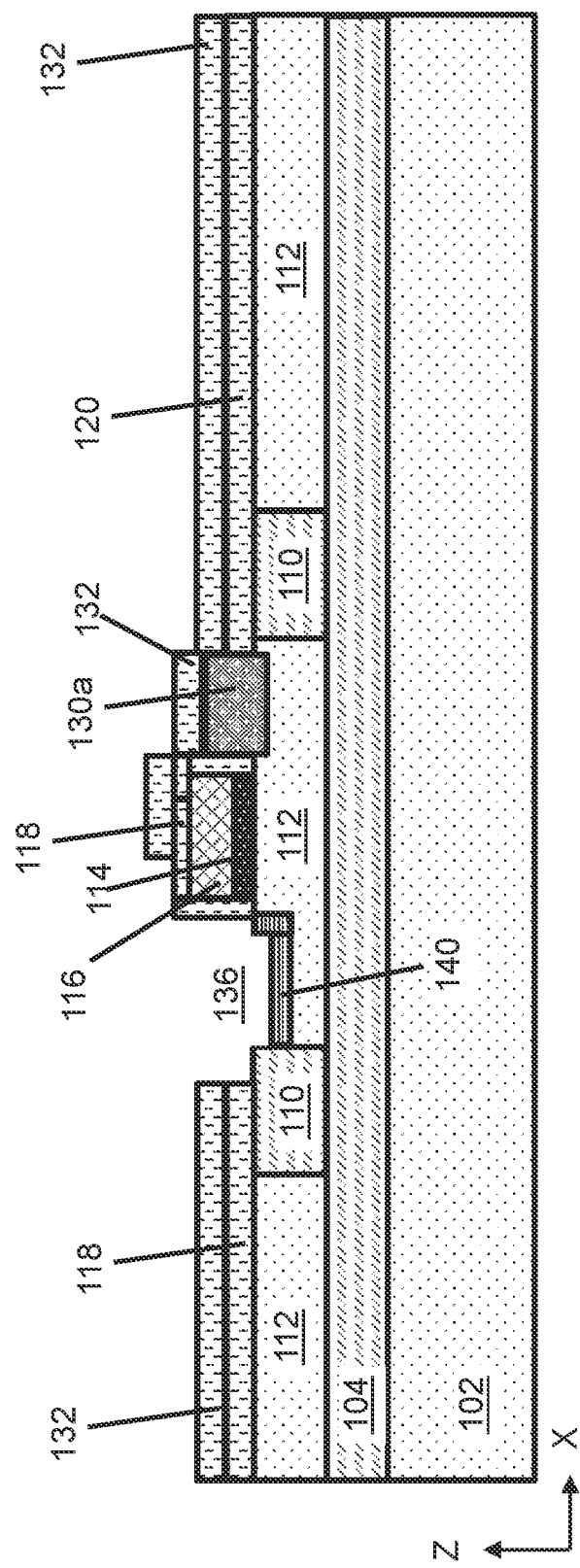
FIG. 6 depicts a cross-sectional view of forming a superlattice layer on the region of semiconductor material according to embodiments of the disclosure.

FIG. 6 depicts removing additional mask 134 and forming a superlattice layer 140 on any exposed surfaces of semiconductor layer 112. Superlattice layer 140 may be formed, e.g., as a silicon/oxygen superlattice made up of alternating layers (films) of oxygen material and silicon material (e.g., single crystalline Si material). In further implementations, other materials and/or combinations (e.g., multiple semiconductors and/or dielectric materials) may be used within superlattice layer 140. The individual layers are identified collectively as superlattice layer 140 for clarity of illustration. However embodied, superlattice layer 140 may be formed a selective semiconductor growth process on semiconductor layer 112 within opening 136, e.g., using an atomic layer of oxygen deposited in an atomic layer deposition (ALD) tool followed by semiconductor growth or deposition via an appropriate tool (e.g., a chemical vapor deposition (CVD) tool). The equipment used to form superlattice layer 140 may be connected in-situ using a low pressure (vacuum) transfer chamber. Units for manufacture may be transferred back and forth between the tool(s) used to form each layer without breaking the vacuum and to allow sufficient film growth.

Figure 7:
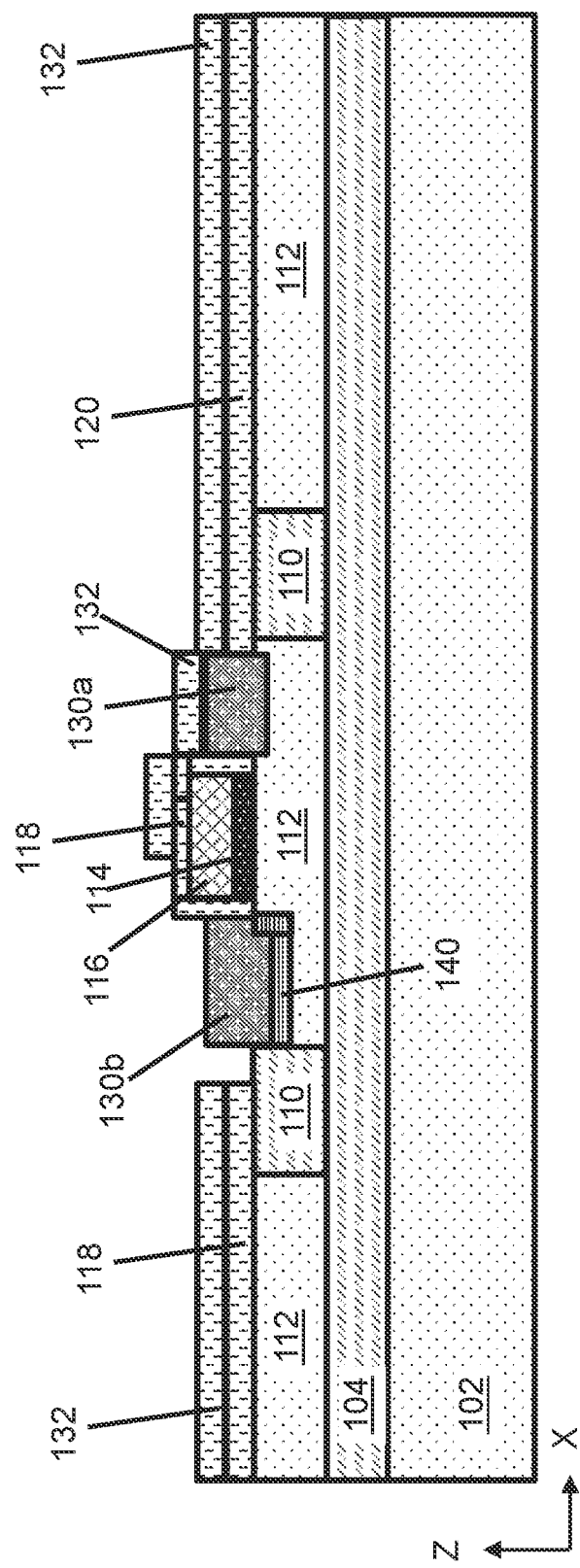
FIG. 7 depicts a cross-sectional view of forming a raised emitter/collector (E/C) terminal on the superlattice layer according to embodiments of the disclosure.

Turning now to FIG. 7, embodiments of the disclosure may include forming another raised emitter/collector (E/C) terminal 130b superlattice layer 140 and above semiconductor layer 112. Raised E/C terminal 130b may be the opposite bipolar transistor terminal from raised E/C terminal 130a (i.e., terminal 130b is a collector when terminal 130a is an emitter and vice-versa). As with raised E/C terminal 130a, raised E/C terminal 130b may be formed by deposition and/or epitaxial growth of silicon and/or other semiconductor materials on semiconductor layer 112 and may be of the same doping type as semiconductor layer 112. Raised E/C terminal 130b, may have a higher concentration of dopants than semiconductor layer 112 thereunder. Although a direct physical interface between semiconductor layer 112 and raised E/C terminal 130b may pose a risk of dopant diffusion from raised E/C terminal 130b into semiconductor layer 112, superlattice layer 140 may impede such diffusion or block it altogether. However, the conductive composition of superlattice layer 140 may allow current to flow between semiconductor layer 112 and raised E/C terminal 130b without being significantly impeded. Superlattice layer 140 thus may yield a substantial difference in dopant concentration between semiconductor layer and raised E/C terminal 130b.

Figure 8:
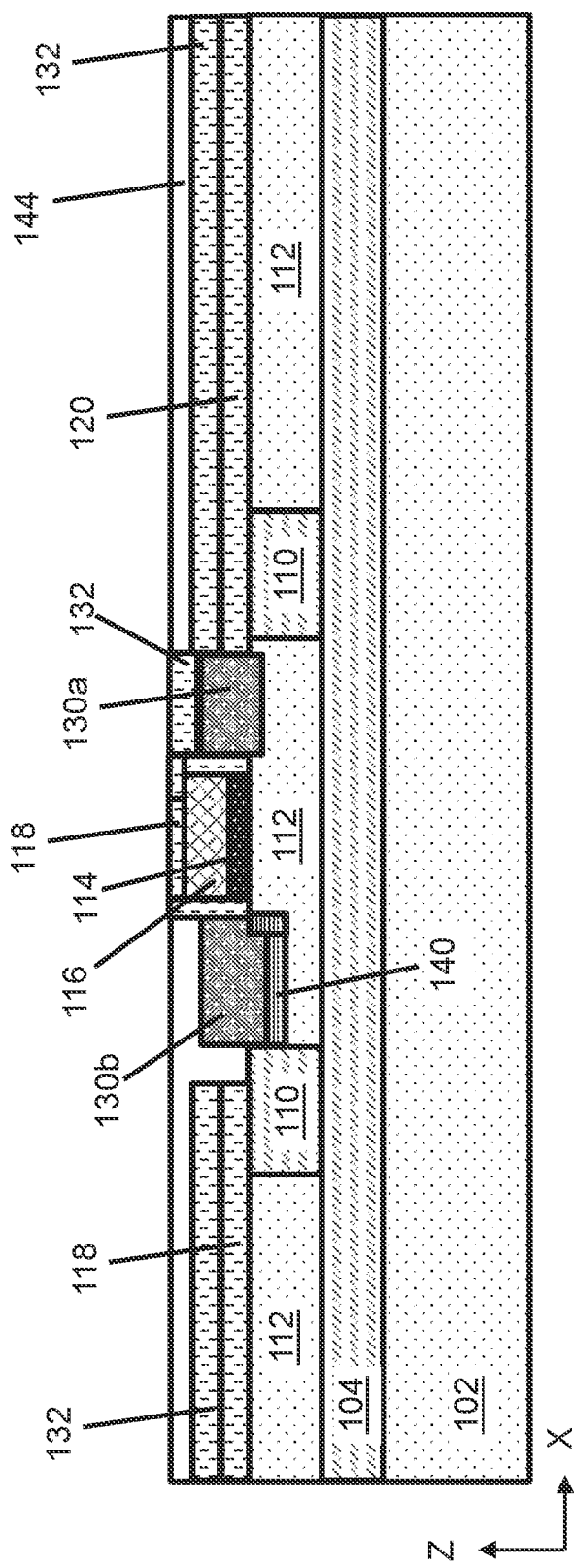
FIG. 8 depicts covering the raised E/C terminals with insulator material according to embodiments of the disclosure.

FIG. 8 depicts the forming of an inter-level dielectric (ILD) layer 144 above additional spacer 132, e.g., by deposition or other techniques of forming an insulative material on a structure. ILD layer 144 may include the same insulating material as TI(s) 110 or may include a different electrically insulative material. ILD layer 144 and TI(s) 110 nonetheless constitute different components, e.g., due to TI(s) 110 being formed within and alongside portions of semiconductor layer 112 instead of being formed thereon. ILD layer 144 at this stage may indicate only a portion of the eventual ILD layer 144 material to be formed over the bipolar transistor structure. After depositing ILD layer 144, ILD layer 144 can be planarized (e.g., using CMP) such that its upper surface is substantially coplanar with insulative cap 118 over polycrystalline layer 116.

Figure 9:
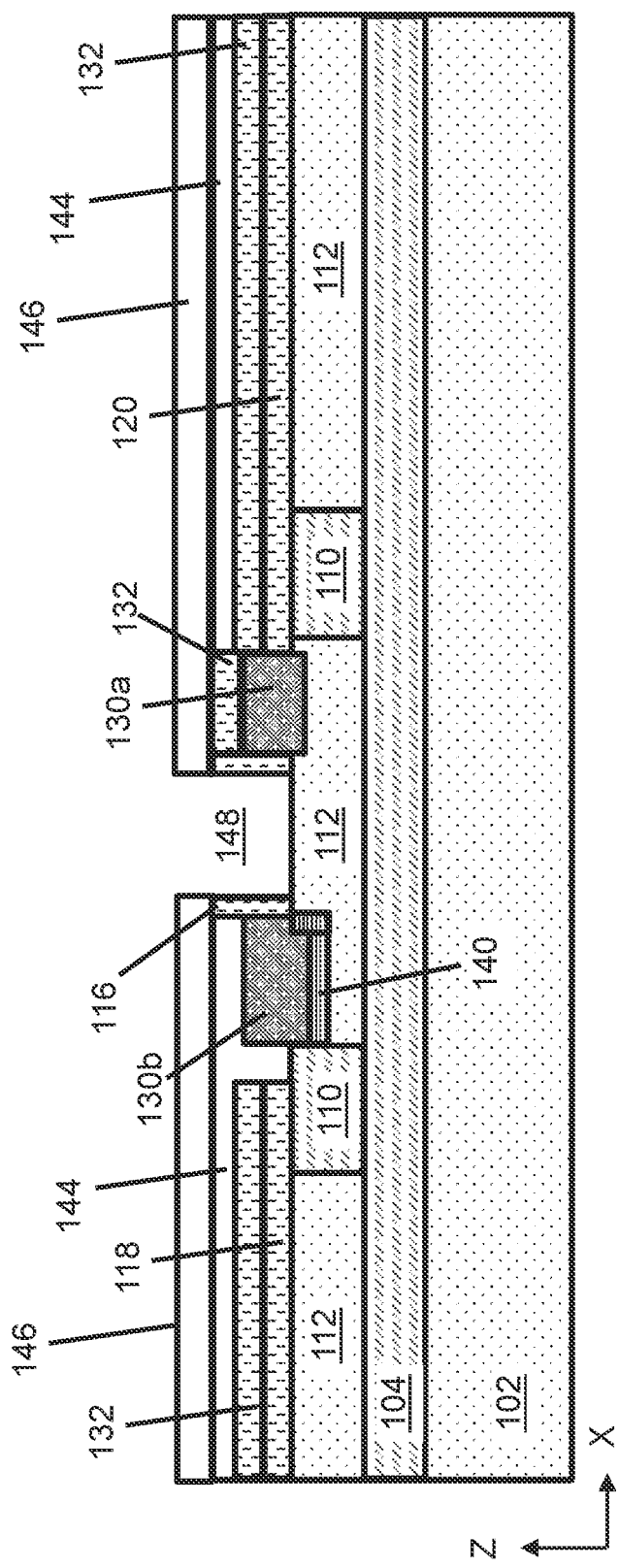
FIG. 9 depicts a cross-sectional view of removing part of the base structure according to embodiments of the disclosure.

Turning to FIG. 9, remaining portions of insulator layer 114 and polycrystalline layer 116 can be removed for eventual replacement with active semiconductor material to provide the base terminal of a lateral bipolar transistor structure. FIG. 9 depicts forming a mask 146 over ILD layer 144 and portions of additional spacer 132 that do not overlie insulator layer 114 and polycrystalline layer 116. With mask 146 in place, polycrystalline layer 116 can be removed (e.g., via etching) to create an opening 148 above semiconductor layer 112. Additionally, insulator layer 114 may provide an "etch stop layer" to initially prevent further etching beneath polycrystalline layer 116. In this case, a different type of etching (e.g., selective etching, wet etchants, etc.) can be used to remove insulator layer 114 without significantly removing or affecting semiconductor layer 112 thereunder.

Figure 10:
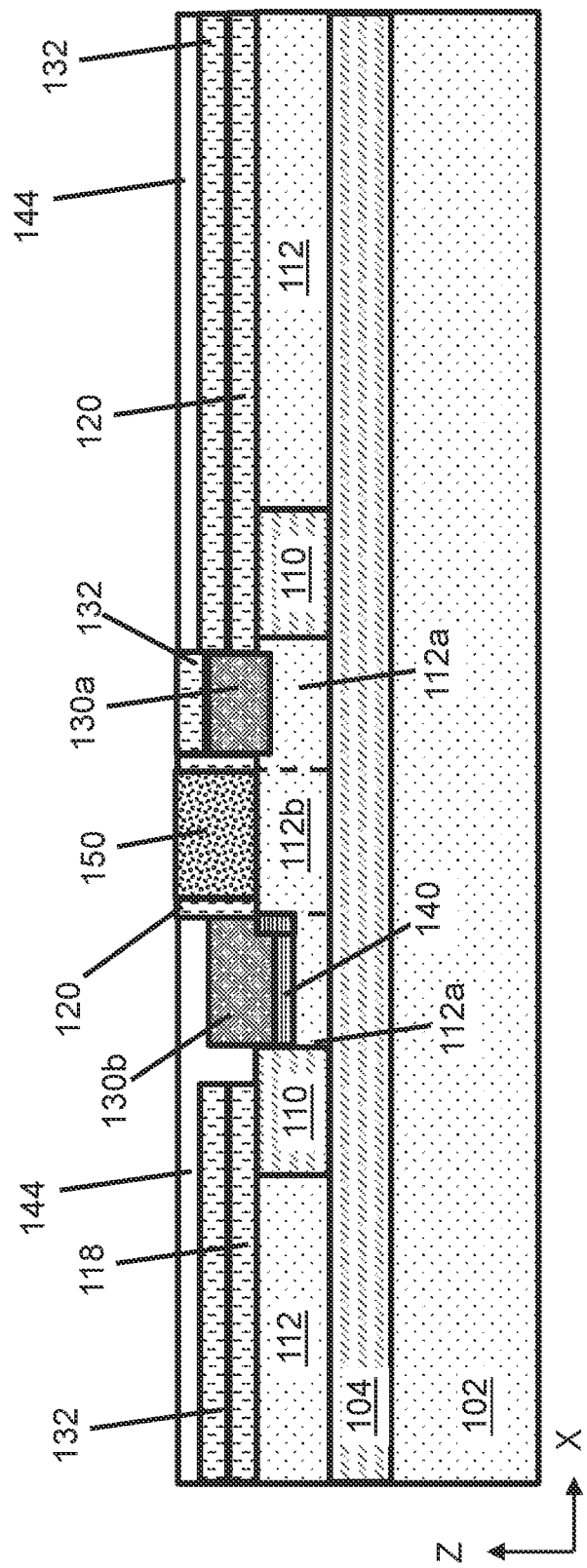
FIG. 10 depicts a cross-sectional view of forming an extrinsic base according to embodiments of the disclosure.

FIG. 10 depicts forming a base terminal 150 (e.g., an extrinsic base material) within opening 148 (FIG. 9). Base terminal 150 may be formed by deposition and/or epitaxial growth of silicon and/or other semiconductor materials within opening 148 and may be of the same doping type as semiconductor layer 112 thereunder. Base terminal 150 can be formed for example by selectively growing silicon material above semiconductor layer 112. Base terminal 150, however, may have a higher concentration of dopants than underlying portions of semiconductor layer 112. In the eventual lateral bipolar transistor structure, base terminal 150 may define a highly doped extrinsic base region while the portions of semiconductor layer 112 below base terminal 150 may define a less highly doped intrinsic base region. Intrinsic base region 112b of semiconductor layer 112 below base terminal 150 may have an optional dopant implant before base terminal 150 is formed and of the same conductivity type as base terminal 150 to form intrinsic base region 112b. The higher doping concentration in base terminal 150 may increase electrical conductivity between base terminal 150 and any overlying contacts for controlling the flow of current through the lateral bipolar transistor structure. Despite the higher concentration of dopants, base terminal 150 may have the same material composition, or a similar material composition, as semiconductor layer 112 (e.g., silicon, SiGe, or a combination of two, and/or other semiconductor material and may contain carbon doping). When base terminal 150 is formed by deposition or non-selective growth, it may be planarized by use of chemical mechanical planarization (CMP) such that its upper surface is substantially coplanar with adjacent spacer layer(s) 120, additional spacer(s) 132, and ILD layer 144. In the eventual bipolar transistor structure, base terminal 150 may be alternatively known as or referred to as an extrinsic base region.

Figure 11:
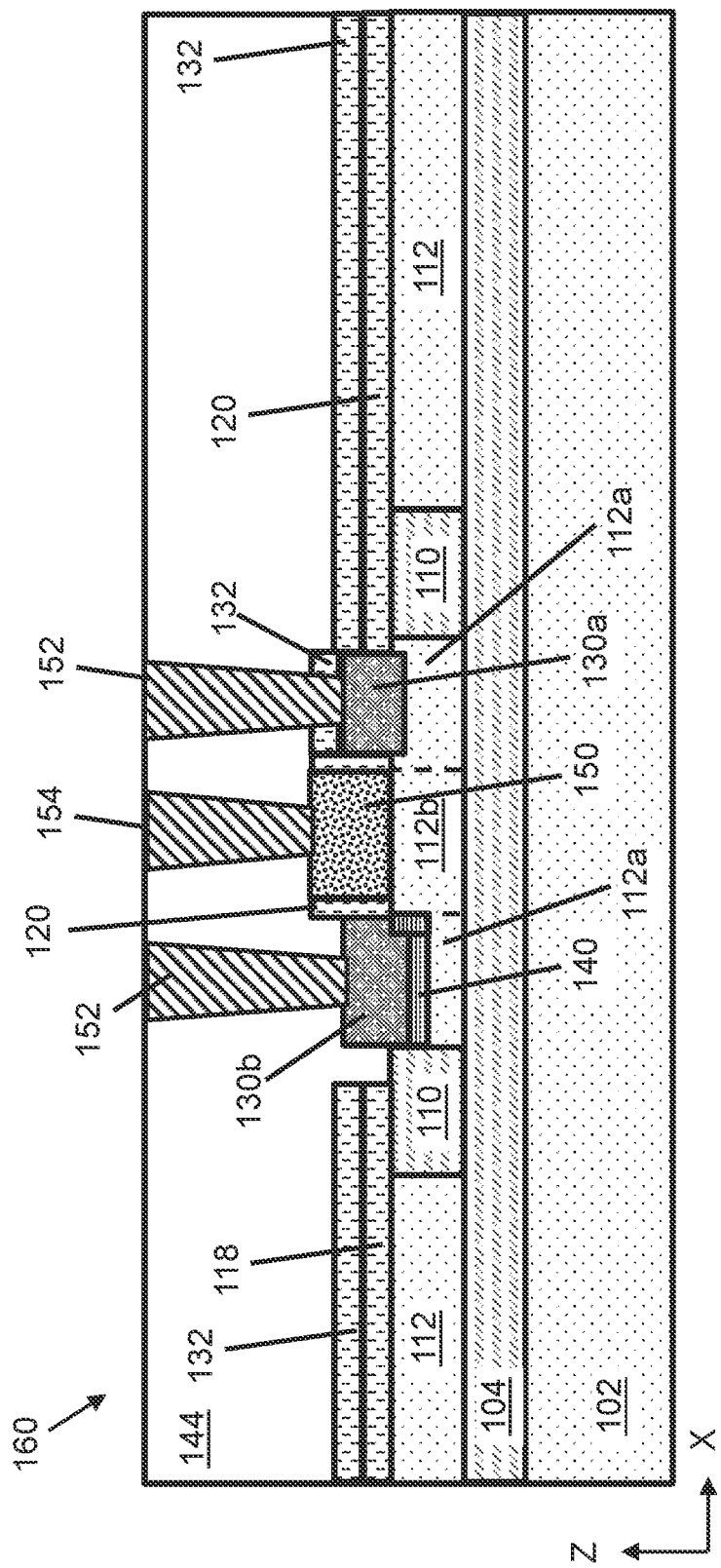
FIG. 11 depicts a cross-sectional view of forming an inter-level dielectric (ILD) and transistor contacts to yield a lateral bipolar transistor structure according to embodiments of the disclosure.

Turning to FIG. 11, additional portions of ILD layer 144 can be formed over previously-formed portions of ILD layer 144 as well as base terminal 150, e.g., by deposition or other techniques of forming an insulative material on a structure. In some implementations (not shown), a silicide layer as known in the art could be formed on upper surfaces of raised E/C terminals 130a, 130b and/or base terminal 150 prior to ILD layer 144 deposition. For example, a Co, Ti, NI, Pt, or similar self-aligned silicide (silicide) could be formed prior to ILD layer 144 deposition. Additional metallization layers (not shown) may be formed on ILD layer 144 during middle-of-line and/or back-end-of-line processing. To electrically couple various components discussed herein to such metallization layers, a set of E/C contacts 152 may be formed on raised E/C terminals 130a, 130b and within ILD layer 144. Portions of insulative cap(s) 118 and/or additional spacer(s) 132 on the upper surface of raised E/C terminals 130a, 130b be removed by vertical etching (e.g., by RIE) as E/C contacts 152 are formed, while other portions of insulative cap(s) 118 may remain intact. Similarly, a set (i.e., one or more) base contacts 154 may be formed on base terminal 150 and within ILD layer 144.

One or more of contacts 152, 154 to overlying circuit elements may be formed within predetermined portions of ILD layer 144 by a controlled amount of vertical etching to form openings to one or more contact sites, and then filling the openings with a conductor. Each contact 152, 154 may include any currently known or later developed conductive material configured for use in an electrical contact, e.g., tungsten (W), copper (Cu), aluminum (Al), gold (Au), etc. Contacts 152, 154 may additionally include refractory metal liners (not shown) positioned alongside ILD layer 144 to prevent electromigration degradation, shorting to other components, etc. As discussed herein, selected portions of base terminal 150 and/or raised E/C terminals 130a, 130b may include silicide regions (i.e., portions of semiconductor that are annealed in the presence of an overlying conductor) to increase the electrical conductivity at their physical interface with contact(s) 152, 154, where applicable.

Figure 12:
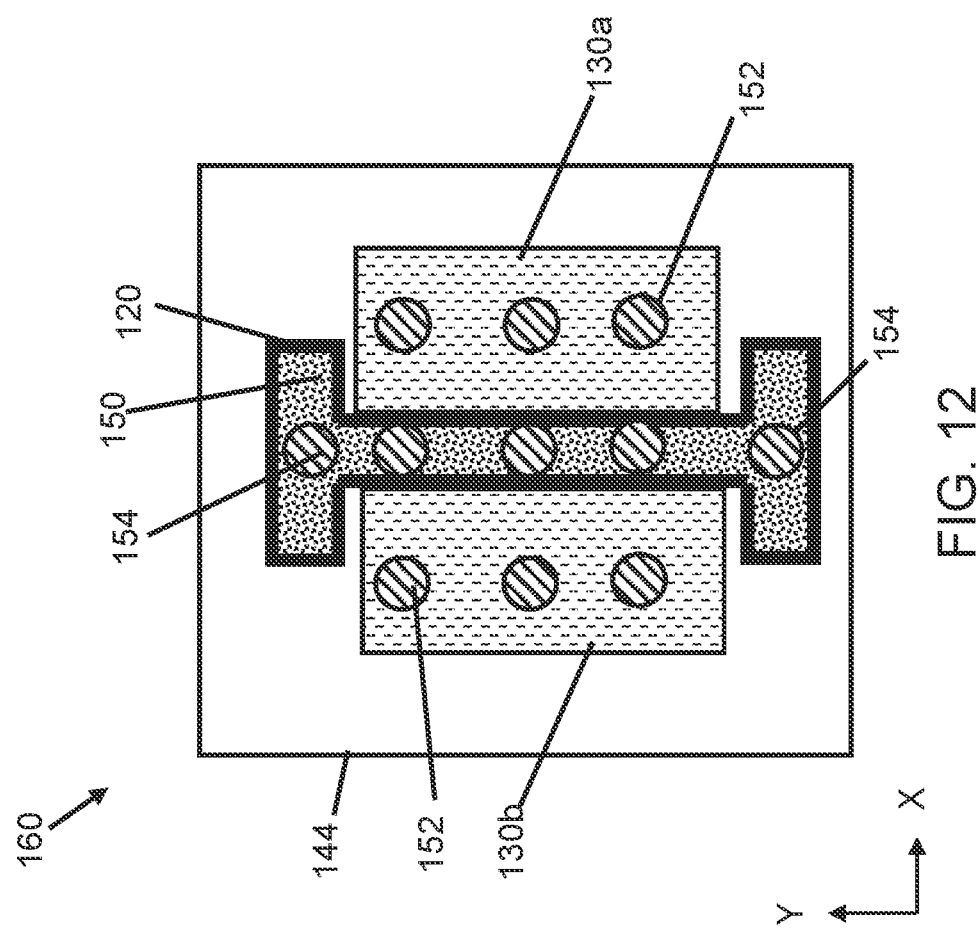
FIG. 12 depicts a plan view of a lateral bipolar transistor structure according to embodiments of the disclosure.

Referring to FIGS. 11 and 12, in which FIG. 12 provides a plan view, embodiments of the disclosure provide a lateral bipolar transistor structure 160 in which superlattice layer 140 is present at the boundary between semiconductor layer 112 and raised E/C terminal(s) 130a, 130b thereover. In some cases, superlattice layer 140 itself may define the physical boundary between semiconductor layer 112 and raised E/C terminal(s) 130a, 130b, e.g., due to horizontally abutting spacer layer(s) 120. The composition of superlattice layer 140 (e.g., alternating thin layers of semiconductor and insulative material) may preserve current flow from raised E/C terminal(s) to semiconductor layer 112, while also blocking ingress of dopant particles from raised E/C terminal(s) 130a, 130b into E/C regions 112a, 112b of semiconductor layer 112 thereunder. Moreover, these aspects of superlattice layer 140 will protect the dopant concentration of an intrinsic base region 112b of semiconductor layer 112, defined as any portion of semiconductor layer 112 that is located vertically below base terminal 150.

The composition of materials within superlattice layer 140, furthermore, ensures that P-N junctions will continue to form within active portions of semiconductor layer 112 that are close to raised E/C terminal(s) 130a, 130b (i.e., those adjacent superlattice layer 140). Where desired, the physical interface between either of E/C region(s) 112a of semiconductor layer 112 and E/C terminal 130a, 130b thereover may not include superlattice layer 140 (i.e., it is free of superlattice material), despite superlattice layer 140 being included between the other E/C region 112a and E/C terminal 130a, 130b. As shown in the plan view of FIG. 12, each base terminal 150 and raised E/C terminal 130a, 130b may have several contacts 152, 154 thereto. Additionally, for lower total base resistance, base terminal 150 may extend along a lateral length that is greater than raised E/C terminal(s) 130a, 130b to provide additional surface area for coupling to base contacts 154.

Figure 13:
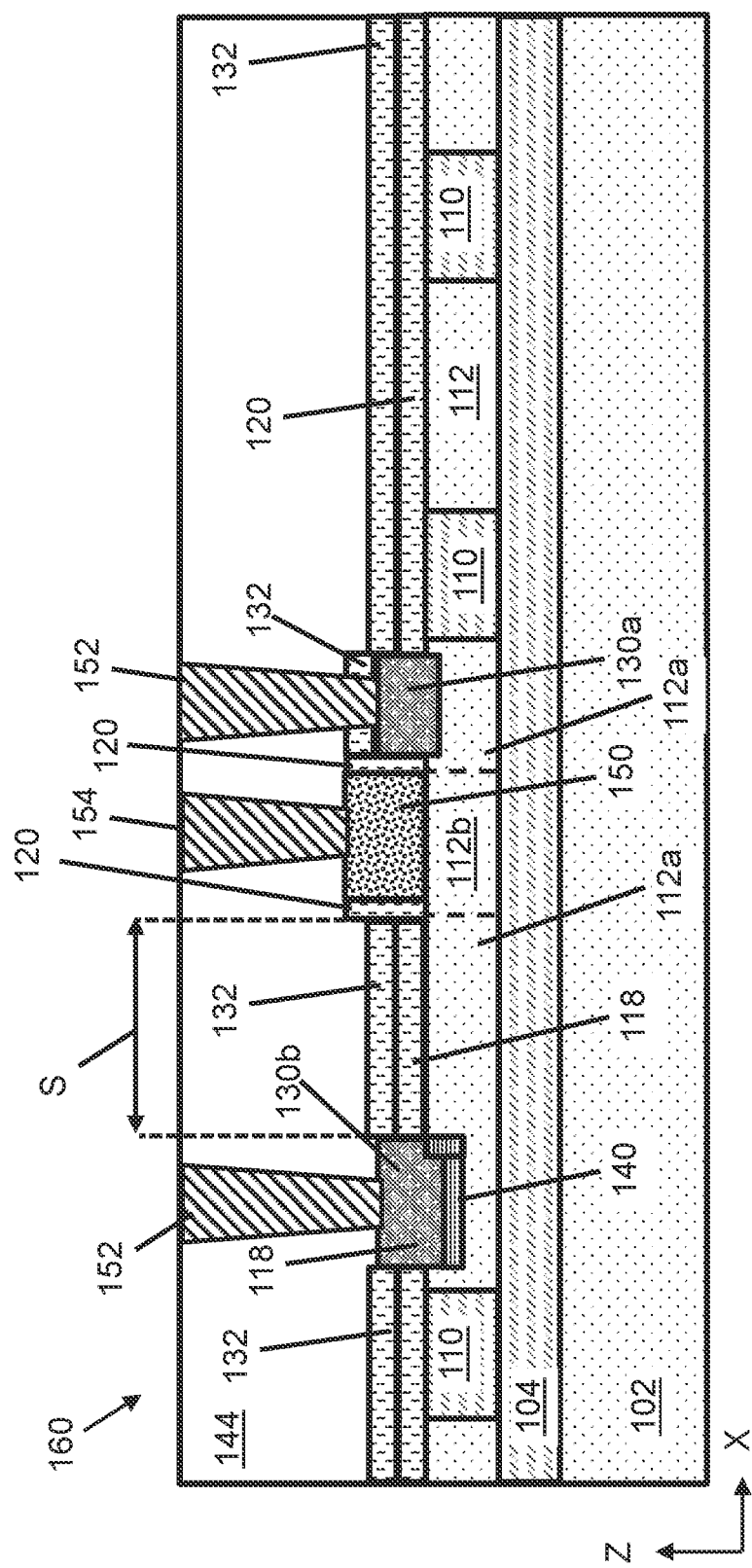
FIG. 13 depicts a cross-sectional view of a lateral bipolar transistor structure with a raised E/C terminal horizontally displaced from a base terminal according to embodiments of the disclosure.

FIG. 13 depicts a further embodiment of lateral bipolar transistor structure 160 in which raised E/C terminal 130b is laterally displaced from base terminal 150. During processing, the location selected to form superlattice layer 140 and E/C terminal 130b thereover (e.g., using mask 134 (FIG. 5)), may be located at a horizontal distance S away from the eventual location of base terminal 150. Horizontal distance S may be chosen to suit a particular application and/or to provide a desired amount of conductivity through semiconductor layer 112. As examples, horizontal distance S may be, e.g., between approximately ten nanometers (nm) and approximately fifty μm. In this example, E/C terminal 130b can be the collector terminal and distance S between intrinsic base region 112b and E/c terminal 130b can be controlled to increase collector-base breakdown voltage ($BV_{CBO}$). In this example, portions of additional spacer 132 and/or insulative cap 118 may be between raised E/C terminal 130b and/or superlattice layer 140 across distance S. Furthermore, in still further implementations, the orientation may be horizontally mirrored such that raised E/C terminal 130b is horizontally adjacent spacer layer 120 and base terminal 150. In this case, raised E/C terminal 130a can be horizontally distal to base terminal 150.

Figure 14:
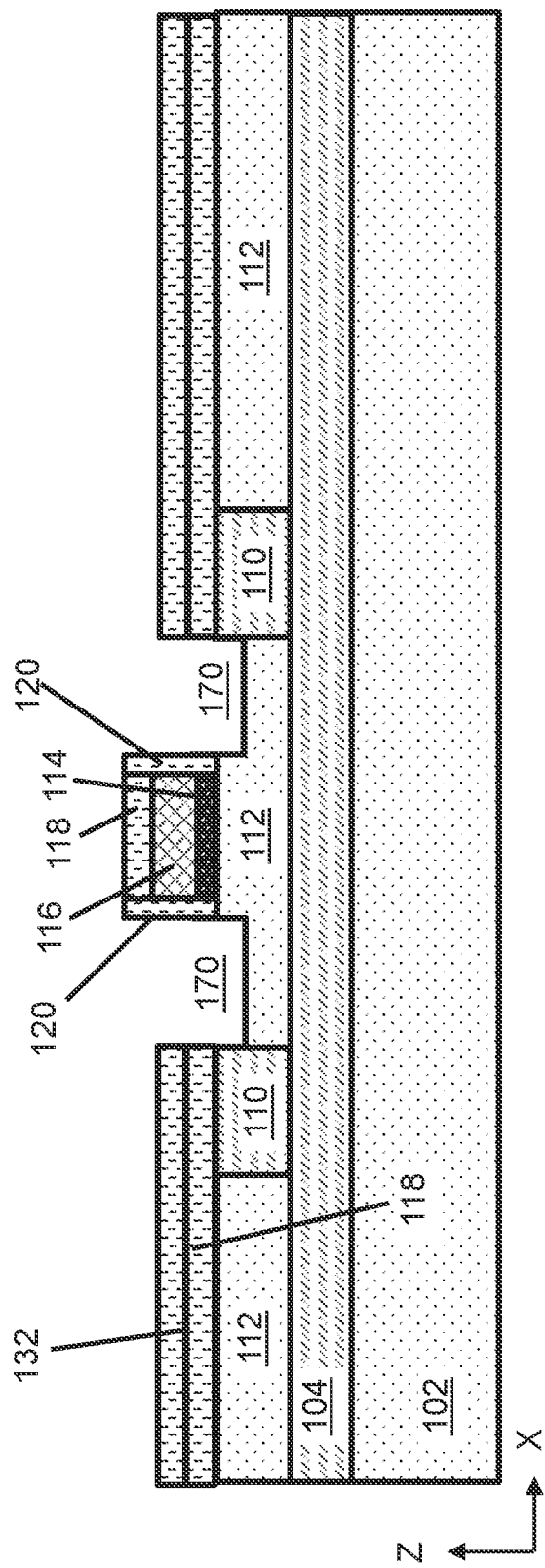
FIG. 14 depicts a cross-sectional view of targeting multiple portions of a semiconductor layer of E/C terminal formation according to embodiments of the disclosure.

Turning to FIG. 14, further embodiments of the disclosure may include forming superlattice material at multiple locations, instead of on only one portion of semiconductor layer 112. In such implementations, processing of semiconductor layer 112 may include forming multiple openings 170, each over a respective portion of semiconductor layer 112. One or both opening 170 may be located adjacent spacer layer(s) 120, but this is not necessarily required in all instances. Openings 170 may be formed substantially as described elsewhere herein regarding opening 136 (FIG. 5).

Figure 15:
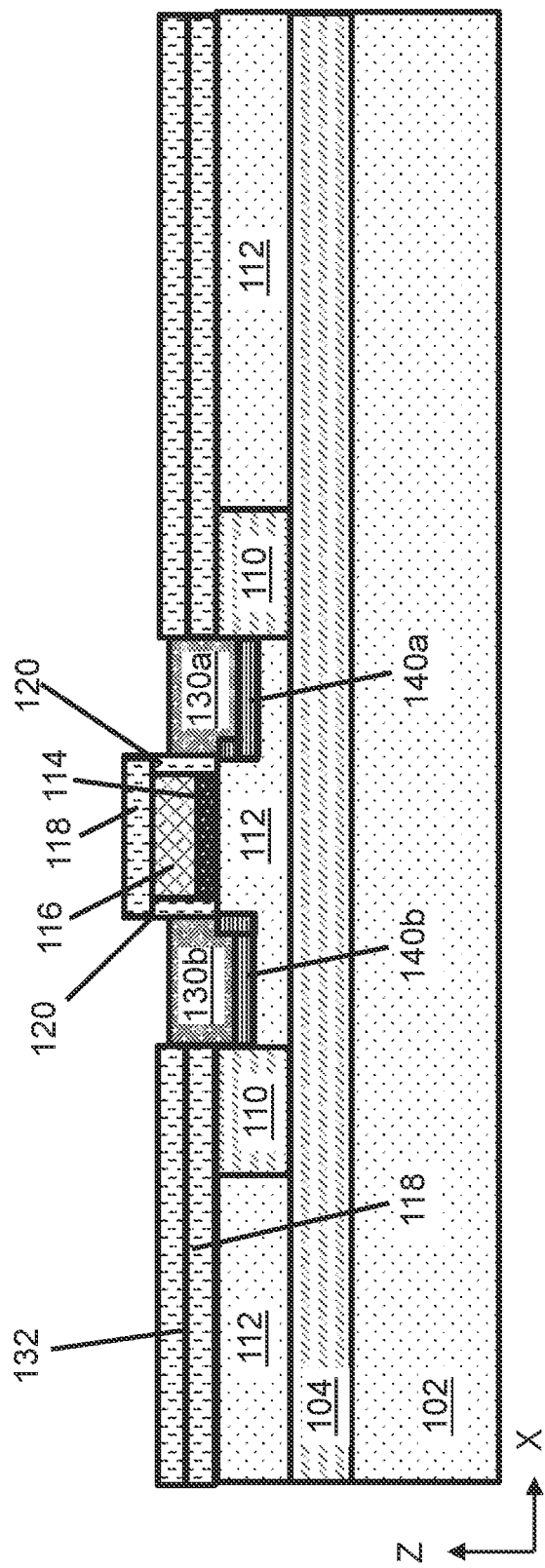
FIG. 15 depicts a cross-sectional view of forming multiple superlattice layers and raised E/C terminals according to embodiments of the disclosure.

As shown in FIG. 15, embodiments of the disclosure may include forming two superlattice layers 140a, 140b at respective locations and raised E/C terminals 130a, 130b substantially as described elsewhere herein. In this case, both the emitter and collector terminals include a respective superlattice layer 140a, 140b above semiconductor layer 112 and below raised E/C terminals 130a, 130b.

Figure 16:
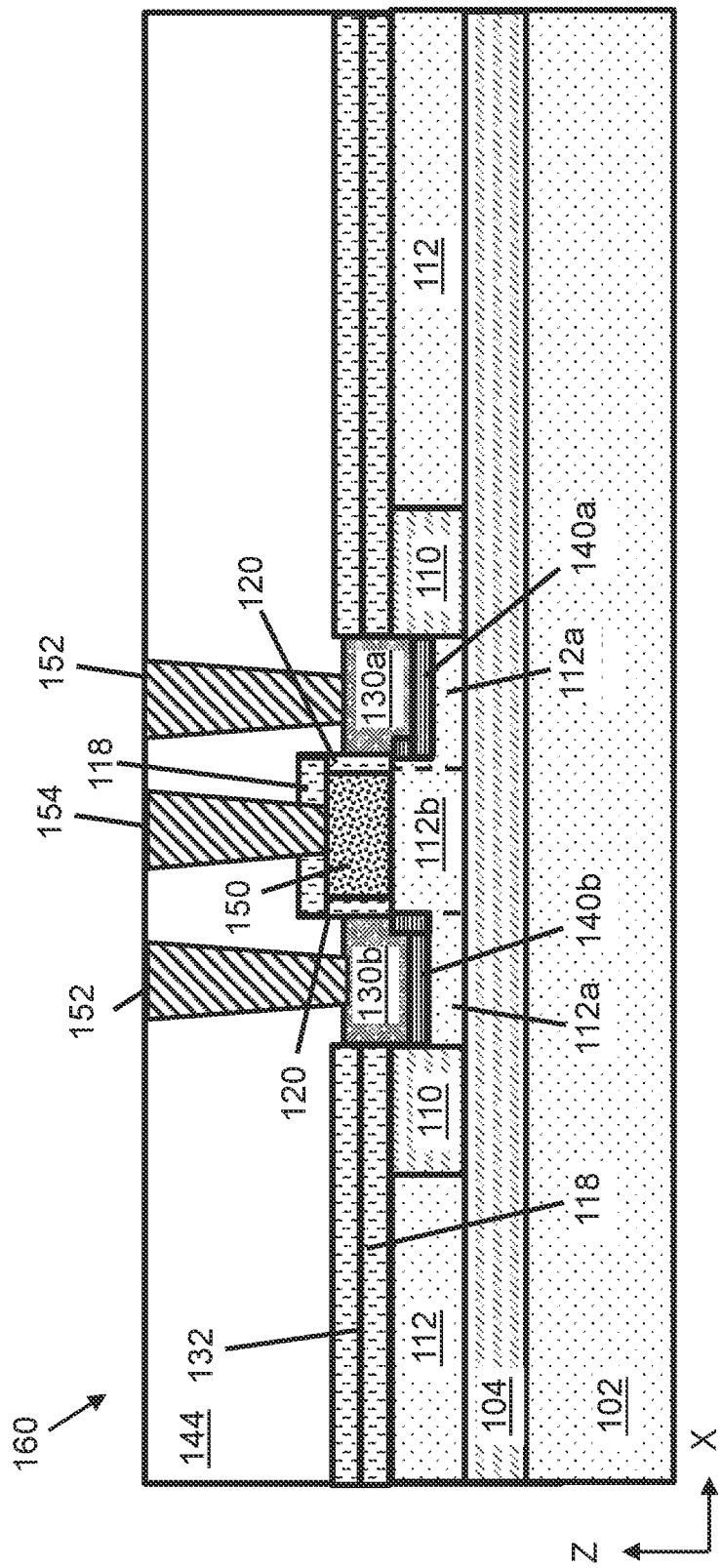
FIG. 16 depicts a cross-sectional view of a lateral bipolar transistor structure with multiple superlattice layers according to embodiments of the disclosure.

FIG. 16 depicts further processing to form base terminal 150 as well as ILD layer 144 and contacts 152, 154 as discussed elsewhere herein. Lateral bipolar transistor structure 160 thus may include multiple superlattice layers 140a, 140b where desired without substantially modifying or departing from other example processing methodologies discussed herein. Multiple superlattice layers 140a, 140b being included may further impede dopant diffusion from raised E/C terminals 130a, 130b into semiconductor layer 112 where desired. The presence of insulative cap 118 and spacer layer(s) 120, additional spacers 132 may also continue to laterally insulate active portions of lateral bipolar transistor structure 160 from each other.

Figure 17:
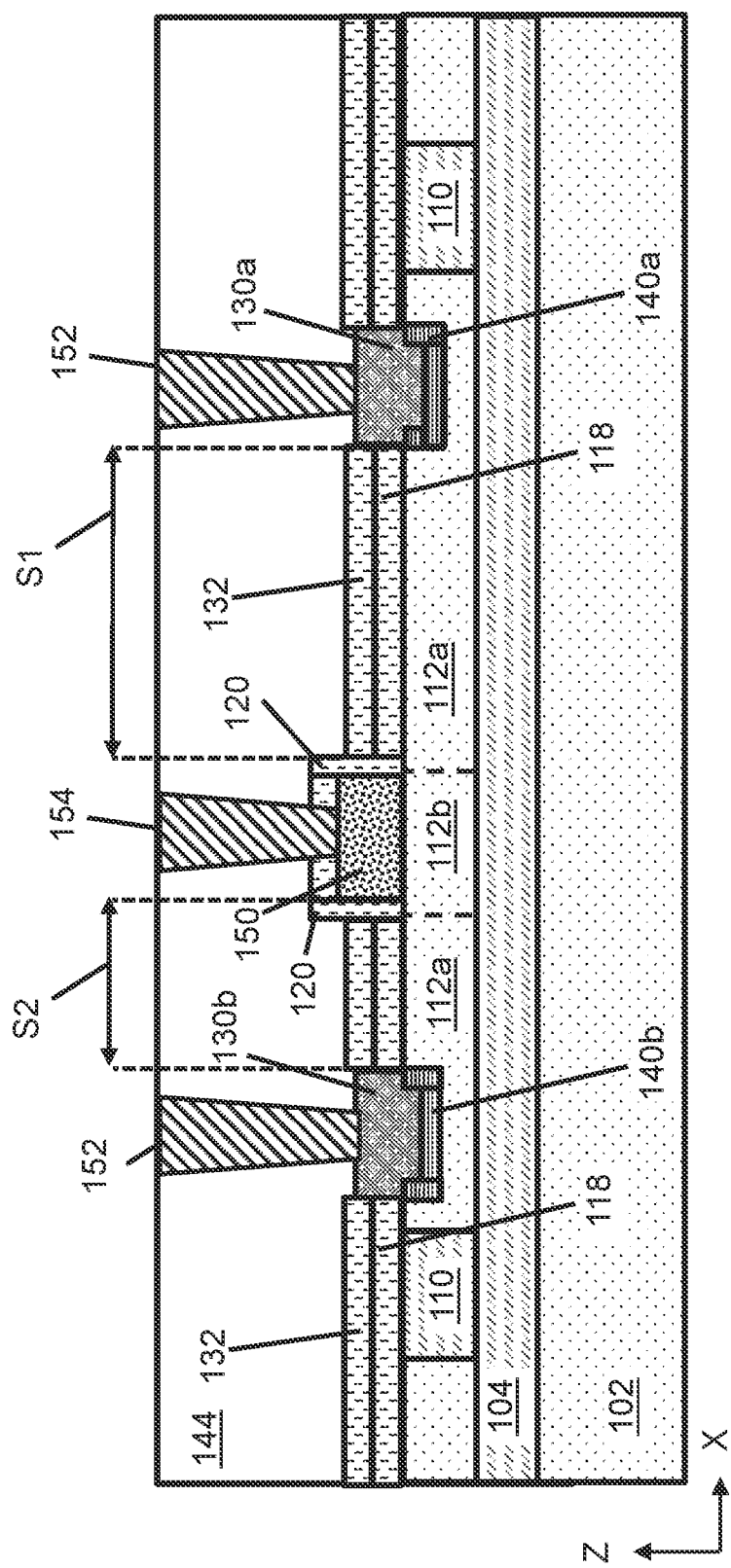
FIG. 17 depicts a cross-sectional view of a lateral bipolar transistor structure with multiple superlattice layers and horizontally displaced E/C terminals according to embodiments of the disclosure.

FIG. 17 depicts a further implementation of lateral bipolar transistor structure 160, in which multiple superlattice layers 140a, 140b are horizontally displaced from base terminal 150 and spacer layer(s) 120. For instance, superlattice layer 140a and raised E/C terminal 130a thereover may be horizontally displaced from spacer layer(s) 120 or base terminal 150 by a first distance S1, such that insulative cap 118 and/or additional spacer 132 horizontally separate raised E/C terminal 130a and superlattice layer 140a from base terminal 150. Similarly, superlattice layer 140b and raised E/C terminal 130b thereover may be horizontally displaced from spacer layer(s) 120 or base terminal 150 by a second distance S2, such that insulative cap 118 and/or additional spacer 132 horizontally separate raised E/C terminal 130b and superlattice layer 140b from base terminal 150. In this case, none of raised E/C terminals 130a, 130b or superlattice layers 140a, 140b horizontally abut spacer layer 120 or base terminal 150. The size of distances S1, S2 can be controlled, selected, etc., to suit various technical applications (e.g., desired conductivity through semiconductor layer 112), IC layouts, or other technical parameters.

Embodiments of the disclosure provide various technical and commercial advantages. The use of superlattice layers 140 on semiconductor layer 112 may reduce or prevent dopant migration from raised E/C terminal(s) 130a, 130b into semiconductor layer 112. Precise control over dopant concentration in active regions of lateral bipolar transistor structure 160 may in turn yield electrical properties that are superior to conventional structures, e.g., cut-off frequency ($f_T$), current gain ($\beta$), early voltage ($V_A$), etc. Embodiments of the disclosure are particularly suitable for use in PDSOI and FDSOI technology, where the height of a bipolar transistor relative to other devices or transistors affects operational characteristics and/or manufacturing. Methods according to the disclosure may use an additional mask (e.g., mask 134 (FIG. 5)) to form and process superlattice layer 140, but this is still advantageous when compared with other processing paradigms to form lateral bipolar transistors.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. A lateral bipolar transistor structure comprising:
 a semiconductor layer over an insulator layer over a substrate and including a first single crystal semiconductor material, wherein the semiconductor layer further includes:
  an intrinsic base region having a first doping type, and
  a first emitter/collector (E/C) region adjacent the intrinsic base region having a second doping type opposite the first doping type;
 a superlattice layer on the first E/C region of the semiconductor layer; and a first raised E/C terminal on the superlattice layer and including a second single crystal semiconductor material, wherein the superlattice layer separates the first raised E/C terminal from the first E/C region and the intrinsic base region.

2. The lateral bipolar transistor structure of claim 1, wherein the superlattice layer includes silicon and oxygen.

3. The lateral bipolar transistor structure of claim 1, further comprising:
a second E/C region of the semiconductor layer adjacent the intrinsic base region and opposite the first E/C region; and
a second raised E/C terminal over a second E/C region of the semiconductor layer, wherein a junction between the semiconductor layer and the second raised E/C terminal is free of superlattice material therebetween.

4. The lateral bipolar transistor structure of claim 3, further comprising:
an extrinsic base on the intrinsic base region of the semiconductor layer; and
a first spacer horizontally between the first raised E/C terminal and the extrinsic base.

5. The bipolar transistor structure of claim 4, further comprising a second spacer horizontally between the extrinsic base and the second raised E/C terminal, and on an upper surface of the second raised E/C terminal.

6. The lateral bipolar transistor structure of claim 4, wherein the first raised E/C terminal is horizontally distal to the first spacer.

7. The lateral bipolar transistor structure of claim 1, wherein the superlattice layer comprises one of a plurality of superlattice layers on the first E/C region of the semiconductor layer, wherein at least two of the plurality of superlattice layers have a different material composition or a different dopant concentration relative to one another.

8. A lateral bipolar transistor structure comprising:
a semiconductor layer over an insulator layer and including a first single crystal semiconductor material, wherein the semiconductor layer further includes:
an intrinsic base region having a first doping type, and
a pair of (E/C) regions having a second doping type opposite the first doping type, wherein the intrinsic base region is horizontally between the pair of E/C regions;
a pair of superlattice layers each on a respective one of the pair of E/C regions of the semiconductor layer, each superlattice layer including a first upper surface above a second upper surface; and
a pair of raised E/C terminals each on a respective one of the pair of superlattice layers and including a second single crystal semiconductor material, wherein each of the pair of superlattice layers is between one of the pair of E/C regions and one of the pair of raised E/C terminals.

9. The lateral bipolar transistor structure of claim 8, further comprising:
an extrinsic base on the intrinsic base region of the semiconductor layer; and
a pair of spacers each horizontally between the extrinsic base and one of the pair of raised E/C terminals.

10. The lateral bipolar transistor structure of claim 9, wherein one of the pair of superlattice layers horizontally abuts one of the pair of spacers.

11. The lateral bipolar transistor structure of claim 9, wherein each of the pair of raised E/C terminals is horizontally distal to each of the pair of spacers.

12. The lateral bipolar transistor structure of claim 8, wherein at least one of the pair of the superlattice layers comprises one of a plurality of superlattice layers on one of the pair of E/C regions, wherein at least two of the plurality of superlattice layers have a different material composition or a different dopant concentration relative to one another.

13. The lateral bipolar transistor structure of claim 8, wherein the semiconductor layer includes silicon germanium (SiGe) within the intrinsic base region and the pair of E/C regions.

14. A method of forming a lateral bipolar transistor structure, the method comprising:
forming a semiconductor layer including a first single crystal semiconductor material, the semiconductor layer further including:
an intrinsic base region having a first doping type, and
a first emitter/collector (E/C) region adjacent the intrinsic base region, and having a second doping type opposite the first doping type;
forming a superlattice layer on the first E/C region of the semiconductor layer; and
forming a raised first emitter/collector (E/C) terminal including a second single crystal semiconductor material on the superlattice layer, wherein the superlattice layer separates the first raised E/C terminal from the first E/C region and the intrinsic base region.

15. The method of claim 14, further comprising:
forming an extrinsic base on the intrinsic base region of the semiconductor layer; and
forming a first spacer horizontally between the extrinsic base and the raised E/C terminal.

16. The method of claim 15, further comprising:
forming a second E/C region within the semiconductor layer adjacent the intrinsic base region and opposite the first E/C region;
forming a second raised E/C terminal on the second E/C region of the semiconductor layer; and
forming a second spacer horizontally between the extrinsic base and the second raised E/C terminal, and on an upper surface of the second raised E/C terminal.

17. The method of claim 15, wherein forming the raised first E/C terminal includes forming the first E/C terminal on a portion of the first E/C region that is horizontally distal to the first spacer.

18. The method of claim 14, wherein forming the superlattice layer includes forming a layer of silicon and oxygen on the first E/C region.

19. The method of claim 14, further comprising forming a second raised E/C terminal over a second E/C region of the semiconductor layer, wherein a junction between the semiconductor layer and the second raised E/C terminal is free of a superlattice material therebetween.

20. The method of claim 14, wherein forming the superlattice layer includes forming a plurality of superlattice layers on the first E/C region of the semiconductor layer, wherein at least two of the plurality of superlattice layers have a different material composition or a different dopant concentration.

\* \* \* \* \*